United States Patent
Charpentier (10) Patent No.: US 7,333,581 B2
(45) Date of Patent: Feb. 19, 2008

(54) METHOD OF PROCESSING DATA FOR A DECODING OPERATION USING WINDOWS OF DATA

(75) Inventor: Sebastien Charpentier, Mougins (FR)

(73) Assignee: NXP B.V., Eindhoven (NL)

( * ) Notice: Subject to any disclaimer, the term of this patent is extended or adjusted under 35 U.S.C. 154(b) by 452 days.

(21) Appl. No.: 10/499,943

(22) PCT Filed: Dec. 20, 2002

(86) PCT No.: PCT/IB02/05696
§ 371 (c)(1),
(2), (4) Date: Jun. 23, 2004

(87) PCT Pub. No.: WO03/056707
PCT Pub. Date: Jul. 10, 2003

(65) Prior Publication Data
US 2005/0078781 A1  Apr. 14, 2005

(30) Foreign Application Priority Data
Dec. 28, 2001  (EP) ................... 01403379

(51) Int. Cl.
*H04L 7/00* (2006.01)
(52) U.S. Cl. .................... 375/372; 375/341; 710/53; 711/155
(58) Field of Classification Search ......... 375/371, 375/372, 272, 341; 370/428, 429; 710/52–56; 711/149, 219, 155
See application file for complete search history.

(56) References Cited

U.S. PATENT DOCUMENTS

| 5,515,494 | A | * | 5/1996 | Lentz | 715/797 |
| 5,657,043 | A | * | 8/1997 | Fukui et al. | 345/100 |
| 5,870,625 | A | * | 2/1999 | Chan et al. | 710/5 |
| 6,728,210 | B1 | * | 4/2004 | El-Khoury et al. | 370/231 |
| 6,912,173 | B2 | * | 6/2005 | Beat | 365/230.03 |
| 2002/0012408 | A1 | | 1/2002 | Nieminen | 375/341 |
| 2002/0056047 | A1 | * | 5/2002 | Lehman | 713/200 |
| 2003/0120886 | A1 | * | 6/2003 | Moller et al. | 711/173 |
| 2004/0044811 | A1 | * | 3/2004 | Vrancic | 710/53 |

FOREIGN PATENT DOCUMENTS

WO  WO 0010254  2/2000

OTHER PUBLICATIONS

Masera et al. "VLSI Architectures for Turbo COdes" Sep. 1999 IEEE vol. 7 No.3, pp. 369-379.*

* cited by examiner

*Primary Examiner*—Temesghen Ghebretinsae (57) ABSTRACT

The present invention relates to a method using windows of data, a window (w) comprising data to be written and to be read and having a size. It is characterized in that it comprises:* A step of writing a current window of data into a unique buffer (BUF) in a first address direction, said first address direction being at an opposite direction from an address direction of the writing of a preceding window of data, said writing of said current window beginning at an address where no data of the preceding window of data have been written, said buffer (BUF) having a length greater than the maximum size of the windows of data, and* A step of reading the data of said preceding window of data from said unique buffer (BUF), from a reading address equal to a last written address of the same preceding window of data, said reading being made simultaneously to said writing of the current window of data and in the same first address direction.

10 Claims, 8 Drawing Sheets

METHOD OF PROCESSING DATA FOR A DECODING OPERATION USING WINDOWS OF DATA

FIELD OF THE INVENTION

The present invention relates to a method for decoding data using windows of data, a window comprising data to be written and to be read and having a size.

Such a method may be used in particular in any system using UMTS standard or some satellite communication.

BACKGROUND OF THE INVENTION

In a system using the UMTS standard, data are decoded when they are received in a receiver of such a system. Such a receiver comprises a decoder on an integrated circuit, which is used to detect and correct some errors during the decoding of said data. To this end, the decoder also currently called turbo-decoder comprises two soft input-soft output decoders also called SISO. Each SISO decoder uses intrinsic information and also extrinsic information coming from the other SISO decoder, a SISO decoder using three calculators $\alpha$, $\beta$, and $\lambda$. In order to do as such, a system of sliding windows is used. It is based on a cutting of data into windows of data. Such a system is applied on the data used by said three calculators.

The first calculator $\alpha$ computes a result data using a previous data.

The second calculator $\beta$ computes a result data using a next data.

The third calculator $\lambda$ computes a result data using the results of the first and second calculators plus an input data.

Figure 1:
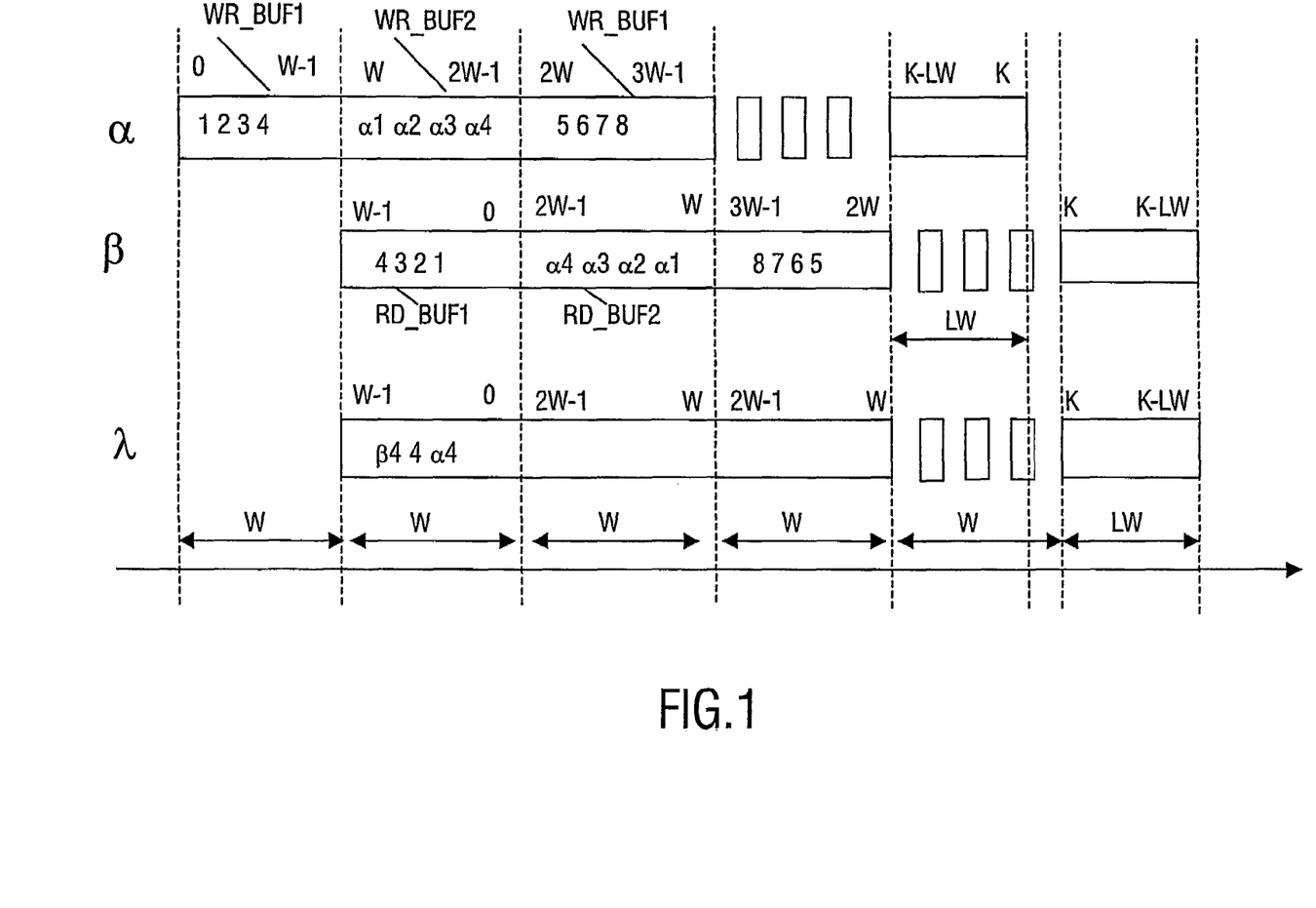
FIG. 1 illustrates a data flow temporal view using a sliding window principle according to the prior art.

The principle of the sliding windows is shown on FIG. 1. Said figure shows a block size of data K with some windows W, LW being the last window size. As we can see, the first calculator $\alpha$ has a data flow that is linear. However, the input data and the result data of the calculation must be stored because the second calculator $\beta$ does a backward mathematical operand. It implies that its input and the first calculator a result data must be stored temporally into two separate buffers BUF1 and BUF2. Thus, during the storage of the incoming data into a first buffer, a second one can be read to calculate the $\beta$ result. For example, first incoming data of a first window 0_W-1 are 1, 2, 3 and 4. They have been written (WR_BUF1) in the first buffer BUF1. Then, a second window of data W_2W-1 is written (WR_BUF2) into the second buffer BUFF2 with the results $\alpha 1$, $\alpha 2$, $\alpha 3$ and $\alpha 4$ of the first calculator $\alpha$, while the first window of data is read (RD_BUF1) from the buffer BUF1 and the second calculator $\beta$ uses the data read 4, 3, 2 and 1 to output its results $\beta 1$, $\beta 2$, $\beta 3$ and $\beta 4$. Then, the third calculator $\lambda$ will be able to deliver a result only after the writing of the first window of data, for example, here with $\beta 4$, 4 and $\alpha 4$.

One major problem of this solution is that on an integrated circuit, a buffer has to memorize around 64 words of 56 bits. As two buffers are needed, it means that 2*64 words of 56 bits have to be memorized. Therefore, on an integrated circuit that comprises said turbo decoder, too much memory is taken for those temporal storage of data and too much energy is spent, which lead to a high cost in term of production.

SUMMARY OF THE INVENTION

Accordingly, it is an object of the invention to provide a method for decoding data using windows of data, a window comprising data to be written and to be read and having a size, which achieve an efficient decoding without taken too much memory for temporal storing said data.

To this end, there is provided a method comprising:

A step of writing a current window of data into a unique buffer in a first address direction, said first address direction being at an opposite direction from a second address direction of the writing of a preceding window of data, said writing of said current window beginning at an address where no data of the preceding window of data have been written, said buffer having a length greater than the maximum size of the windows of data, A step of reading the data of said preceding window of data from said unique buffer, from a reading address equal to a last written address of the same preceding window of data, said reading being made simultaneously to said writing of the current window of data and in the same first address direction.

As we will see in detail further on, such a method enables to reduce the memory taken for the temporal storage of said data as the method used only one buffer, said buffer being greater than the size of the windows. Furthermore, the writing of a current window of data doesn't begin at a same written address than the written addresses of the preceding window. It means, that the reading of the preceding window of data and the writing of the current window of data are shifted from at least one address. Thus we can write a data A and read a data B into the buffer at the same time, which has the advantage of gaining time.

In a preferred embodiment, the buffer has a length equal to the maximum size of the windows of data plus one. This embodiment has the advantage of reducing drastically the memory taken for the temporal storage.

BRIEF DESCRIPTION OF THE DRAWINGS

Additional objects, features and advantages of the invention will become apparent upon reading the following detailed description and upon reference to the accompanying drawings in which.

DETAILED DESCRIPTION OF THE INVENTION

In the following description, well-known functions or constructions by a person skilled in the art are not described in detail since they would obscure the invention in unnecessary detail.

Figure 8:
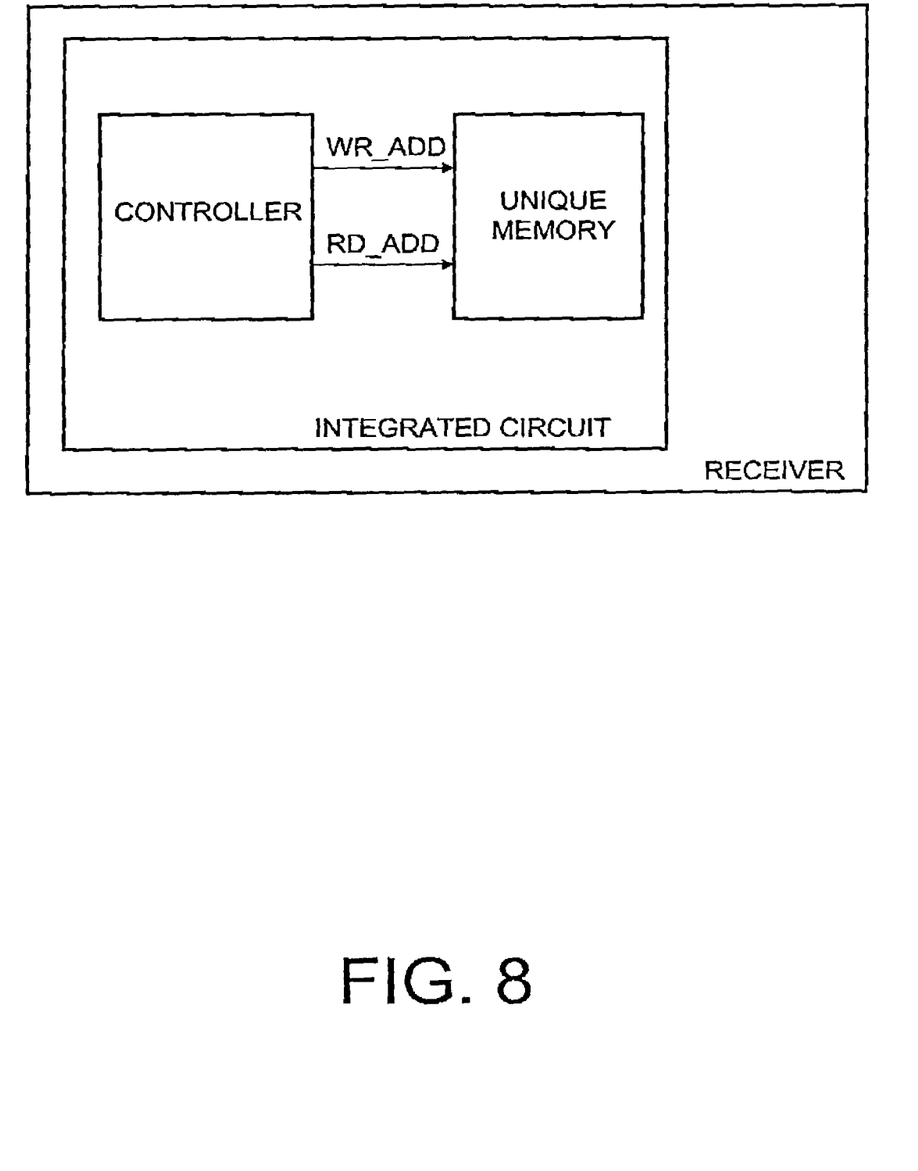
FIG. 8 shows a receiver including an integrated circuit including a turbo-decoder.

The present invention relates to a method for decoding data using sliding windows. Said method is used in particular in a turbo-decoder within an integrated circuit, said integrated circuit being embedded in a UMTS communication system and more particularly in a receiver such as is shown in FIG. 8, for example a receiver of a mobile phone.

When the receiver receives some data, there might be some errors in the received data because of the transmission.

The receiver through its turbo decoder has to detect the errors and correct them. To this end, the turbo decoder comprises SISO modules (Soft Input Soft Output) and a unique buffer BUF for temporal storage of data. Each SISO decoder cooperates with the other by using intrinsic information and also extrinsic information coming from the other SISO decoder, a SISO decoder using three calculators $\alpha$, $\beta$, and $\lambda$.

In order to manage the cooperation of each SISO decoder together, the turbo decoder uses a system of sliding windows of data that is applied on the data used by the three calculators $\alpha$, $\beta$, and $\lambda$. The system of sliding windows is based on a cutting of incoming data into windows of data; a window w of data having a size SIZE that can be different from other windows w.

Data of a window w are temporally memorized in the unique buffer BUF. Said buffer BUF has a length greater than the maximum size MAX_SIZE of the windows of data. It also means that the buffer BUF comprises a number of addresses, which is greater than the maximum size of the windows of data. The length of a buffer BUF is a number of words that can be memorized within said buffer, a word containing a certain number of bits.

Preferentially, the buffer has a length equal to the maximum size of the windows of data plus one, i.e. it length is equal to the maximum number of data comprised in a window+1. It also means that the buffer BUF comprises a number of addresses which is equal to the maximum size of the windows of data+1. The added address is an extra word memory address WORD.

Figure 2:
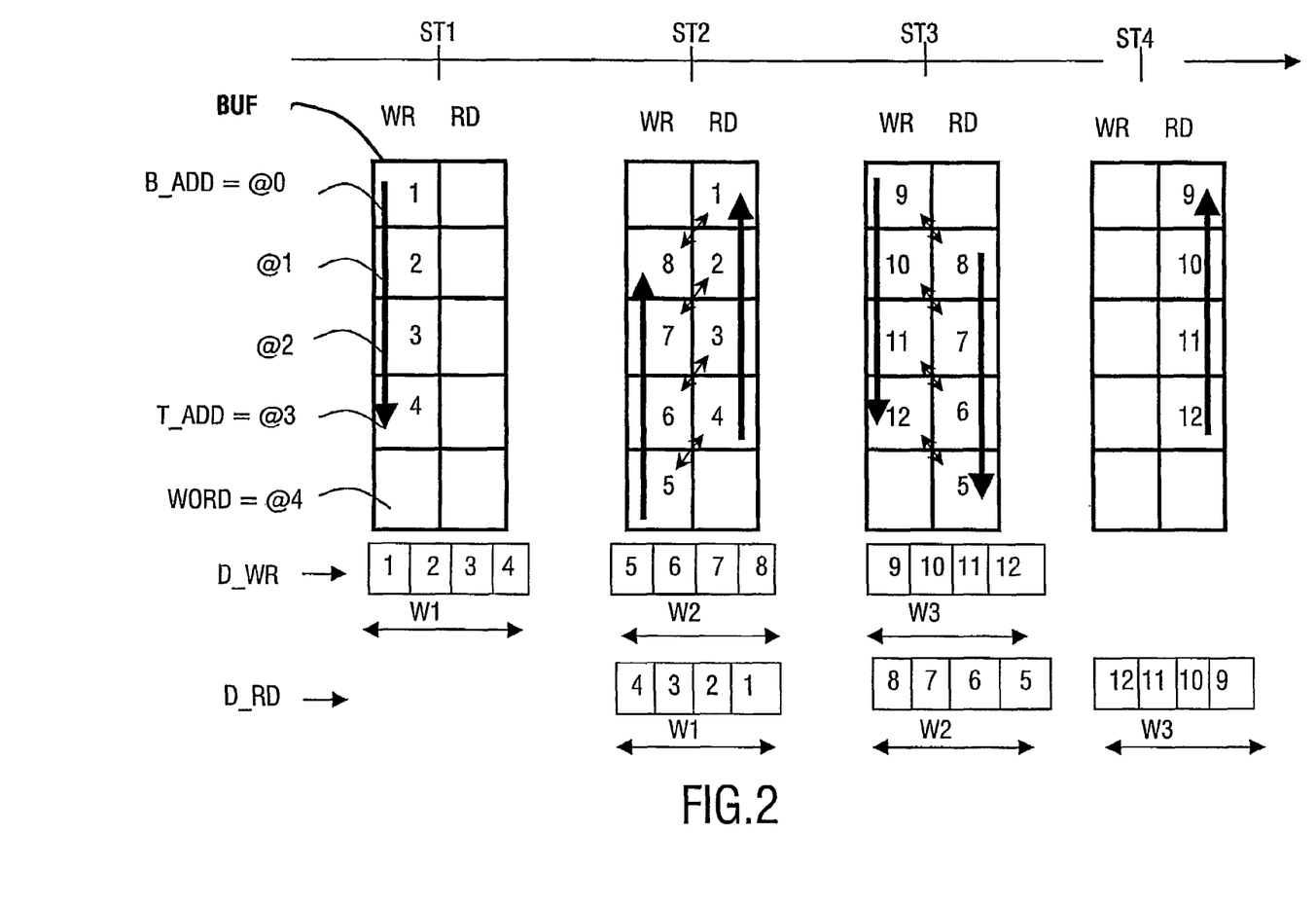
FIG. 2 is a schematic diagram of a data to be written and read in a buffer used by the method according to the invention during an ideal sequence of data.

FIG. 2 shows a buffer BUF and windows w of a sequence of data to be read D_RD or written D_WR into said buffer BUF. In this example, the sequence of data is an ideal sequence, i.e. the number of data to be read or to be written is the same during each window w in other word, all the windows w have a same size SIZE.

In this example, one window w contains at the most 4 data, i.e. the size of a window is equal to 4. Therefore, here, the buffer BUF has a length equal to: 4+1*number of bits within one data, and the number of addresses within said buffer is 5.

The buffer BUF has a bottom address B_ADD, a top address T_ADD, and an extra word memory address WORD that is added just after the top address T_ADD. They correspond respectively to the addresses illustrated @0, @3 and @4.

In practice, in a usual turbo-decoder on a standard integrated circuit, its length would be of 64 words+1 of 56 bits.

During a first step ST1, a first window w1 containing 4 data 1, 2, 3 and 4 is written in the buffer BUF, beginning from one of the extremity of the buffer, here from the bottom address B_ADD. There are no data to be read.

Then, at step ST2, the current window to be written is the second window w2 which contains the data 5, 6, 7 and 8; and the preceding window w1 has to be read in an inverse order, i.e. the data 4, 3, 2 and 1 are to be read. The writing of the current window w2 and the reading of the preceding window w1 are done simultaneously in a same address direction, said address direction being at an opposite direction from the address direction of the writing of the preceding window of data w1. The address direction is, in this case, going from the top address to the bottom address of the buffer BUF.

Furthermore, the reading of the preceding window of data w1 begins from a reading address equal to the last written address of the same preceding window of data w1. It means that it begins here from the top address T_ADD=@3. This has the advantage to read the right data.

Moreover, the writing of the current window of data w2 begins at an address where no data of the preceding window of data w1 have been written. It means that it begins here at the extra memory address WORD=@4. Thus, the data 5 is written from the extra word memory address WORD, whilst the reading of the data 4 begins from the top address T_ADD. This has the advantage to avoid erasing a data to be read by a data to be written.

Then, we read 3 and we write 6 (the 4 is erased); we read 2 and we write 7 (the 3 is erased); we read 1 and we write 8 (the 2 is erased). Thus, thanks to this extra word memory address, to the simultaneity between said writing and said reading, we avoid overwriting a data that we need to read by a data that we need to write. Furthermore, thanks to the writing and reading from an opposite direction of the writing of the preceding window of data, we avoid also erasing some data we need to read.

At step3 ST3, the third window w3, which contains the data 9, 10, 11 and 12, is the current data to be written; and the data to be read in an inverse order are those of the preceding second window w2, i.e. 8, 7, 6 and 5, that have been saved previously. As we can see, said new writing and reading are done also from an opposite direction of the writing of the preceding window of data w2. The reading of the preceding second window of data w2 begins from the last written address used for the writing of said preceding second window w2, i.e. from the address @1, while the writing of the current third window w3 begins at an address where no data of the preceding second window w2 have been written, i.e. from the address @0.

Hence, the data 9 is written from the bottom address B_ADD=@0 (the data 1 is erased), whilst the reading of data 8 begins from the address @1. Then, we read 7 and we write 10 (the 8 is erased); we read 6 and we write 11 (the 7 is erased); we read 5 and we write 12 (the 6 is erased).

At step 4 ST4, there are only four data of the preceding third window w3 to be read in an inverse order, i.e. 12, 11, 10 and 9, that have been saved previously.

The reading begins from a reading address equal to the last written address of said third window, i.e. from the address @3; and the reading is made at an opposite direction of the writing of said preceding third window w3. It goes from the top address T_ADD=@3 to the bottom address B_ADD=@0.

Figure 3:
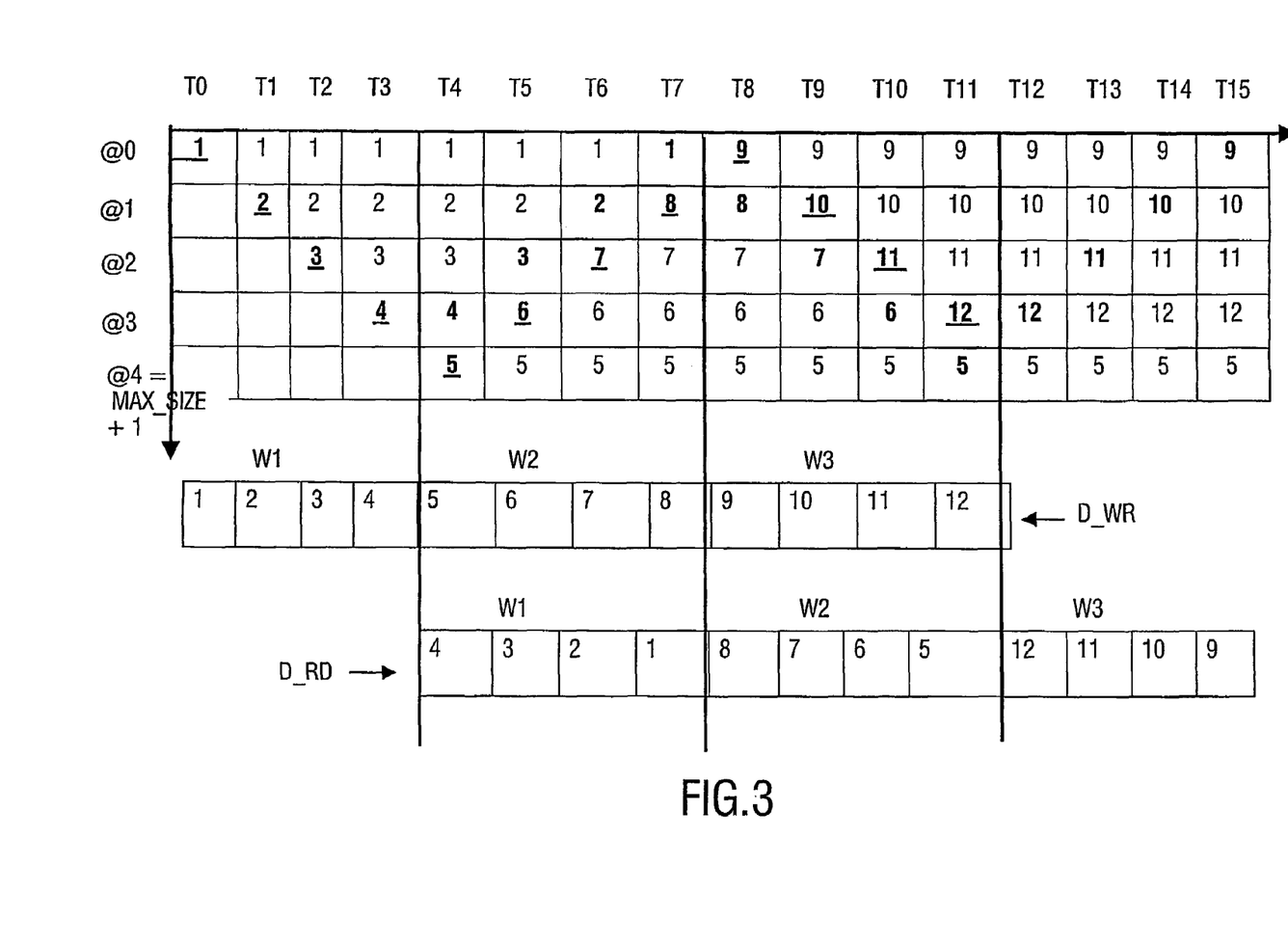
FIG. 3 shows the time life of each data stored into a buffer used by the method according to the invention during an ideal sequence of data.

FIG. 3 shows the time life of each data stored for the same example.

On the Y-axis, we have the addresses of the buffer BUF beginning from the bottom address B_ADD=@0 to the extra word memory address WORD=@4, said memory address being equal to the maximum size MAX_SIZE of a window w+1. On the X-axis, we have the time T taken to read and write all the incoming data.

In bold underscored and italics, we have the written data, in bold, we have the read data, and the others are the written data that remained in the buffer BUF and are not read or erased during a time T.

The windows are also represented. One window w is illustrated by data to be written D_WR and by data to be read D_RD.

At T0, we begin by the first window w1 of data to be written. At T0, we write the data 1 at the address @0; at T1, we write the data 2 at the next address @1; at T2, we write the data 3 at the next address @2; and at T3, we write the last data 4 of this first window w1 at the next address @3.

Then the current window of data to be written is the second window w2 and the first window w1 is the preceding window to be read. Thus, in parallel, at T4 we write the data 5, we read the data 4; at T5, we write the data 6, we read the data 3; at T6, we write the data 7, we read the data 2 etc. . . . until the last window w3 is read, said reading ending at T15.

It can be noted that the buffer BUF can have a greater length, for example a length equal to 6, i.e. the addresses go from @0 to @5. In this case, the writing of a current window can begin at the address @5 for example.

As we can see, thanks to the method according to the invention, we gain a lot of time because the reading and the writing are done in parallel.

This example illustrated at FIGS. 2 and 3 was for an ideal sequence. But, often, we don't receive an ideal sequence of data, but a classic sequence of data. A classic sequence of data has a last window w, which is smaller than the other, i.e., which contains a smaller number of data. In other words, the size SIZE of the last window is different from the size of the other windows.

Figure 4:
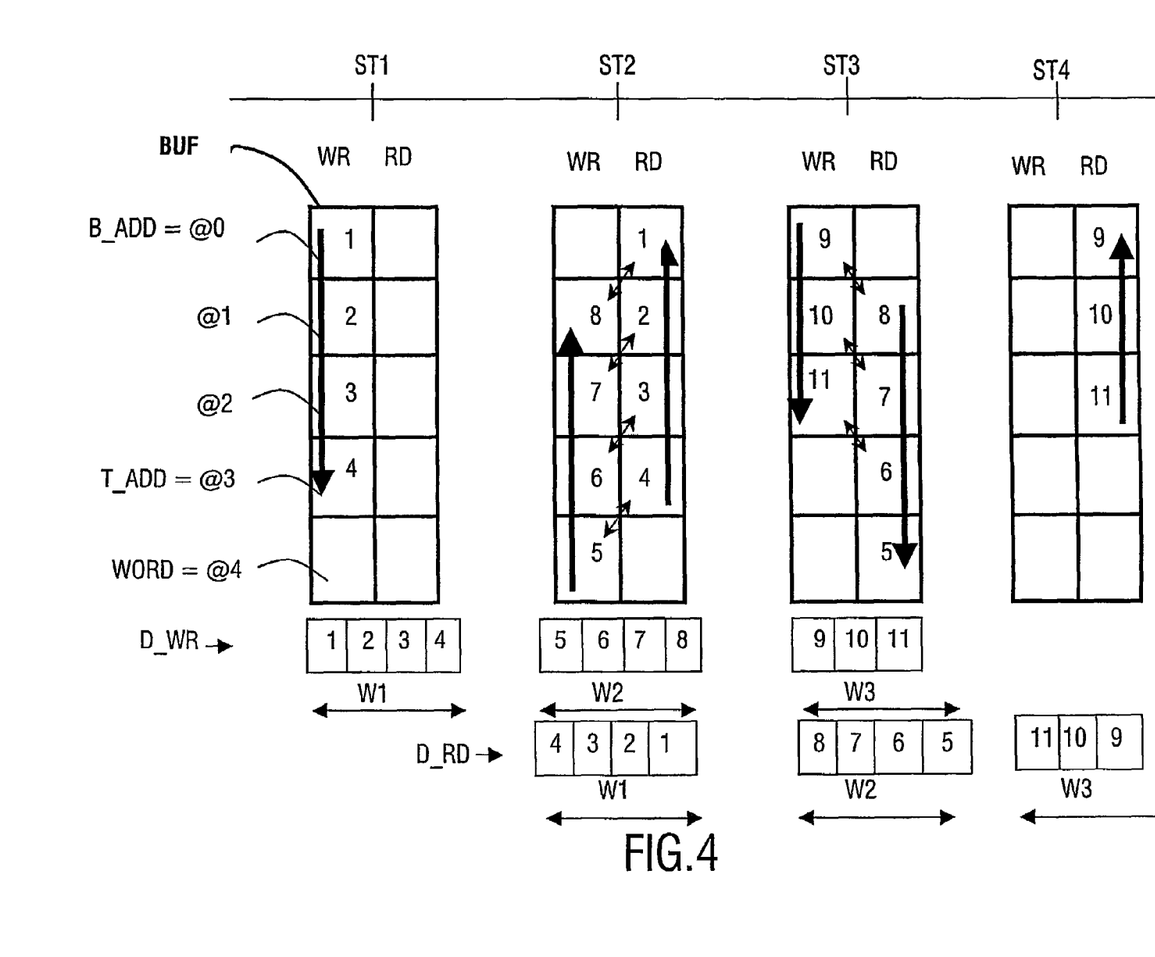
FIG. 4 is a schematic diagram of data to be written and read in a buffer used by the method according to the invention during a classic sequence of data.

It is the case on the example shown on FIG. 4. The last window w3 contains only 3 data while the other contain 4 data.

As we will see further on, if we apply the steps of the method afore-mentioned, we will be able to manage correctly such a last window.

In case of such a window, we need to jump to the good address. Therefore, by beginning a reading of such a last window from the last address written at the same preceding window of data, as mentioned before, the reading of this last window is also done correctly. Here at the reading address begins at the address @2.

Figure 5:
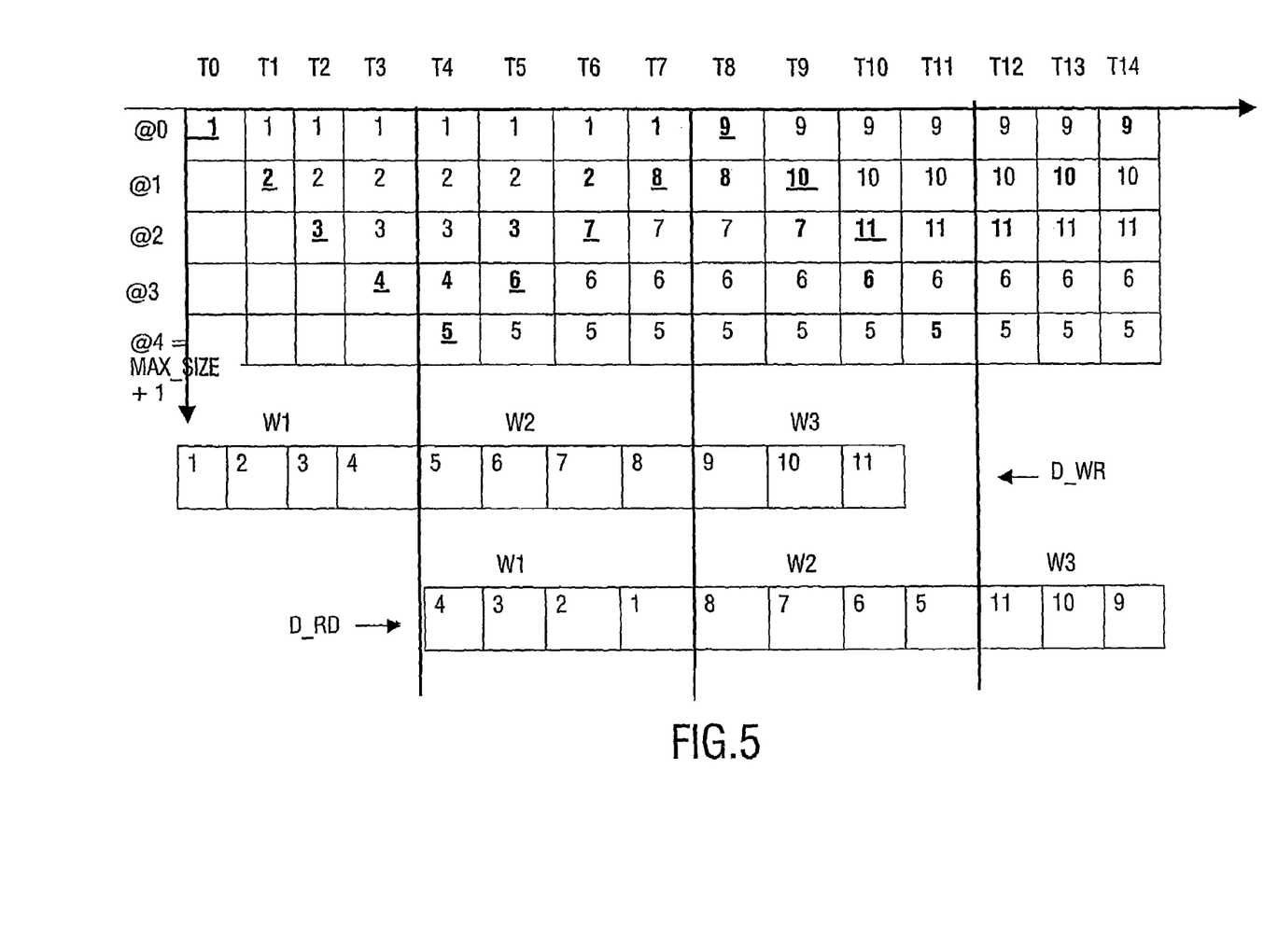
FIG. 5 shows the time life of each data stored into a buffer used by the method according to the invention during a classic sequence of data.

FIG. 5 shows the time life of each data stored for the classic sequence. As we can see, the beginning is the same as those explained for the ideal sequence. But at T11, there is no more writing, whilst the data 5 of the preceding second window w2 is read. Then at T12, we begin the reading of the preceding third window w3. There is a jump to the good address to read the data 11 and not the data 6.

As it can be noted, the method according to the invention applies adequately to an ideal sequence as well to a classic sequence.

In order to achieve the implementation of the method aforementioned, counters with parallel inputs are necessary. Thus, the turbo decoder comprises a controller CTRL that manages such counters as it can be seen on FIG. 6. Said controller CTRL comprises two modules, a first module WR_CNT_ADD to manage a write address counter, and a second module RD_CNT_ADD to manage a read address counter.

Figure 6:
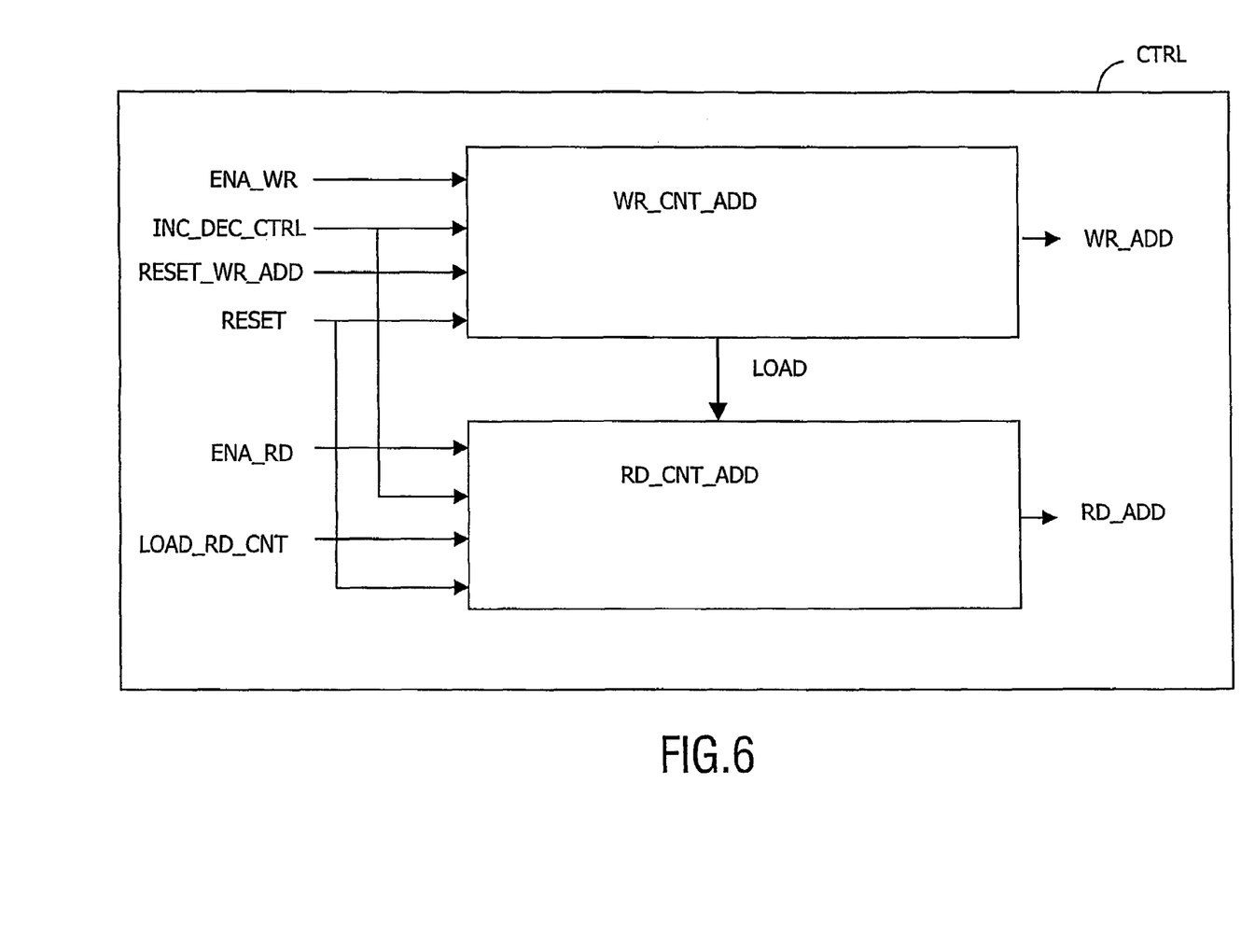
FIG. 6 is an architecture of addressing counters enabling the method according to the invention of FIGS. 2 to 5.

The first module WR_CNT_ADD has preferentially four inputs signals. The first one ENA_WR is a signal for enabling a writing, hence for enabling a counter; the second one INC_DEC_CTRL is a signal for incrementing or decrementing the addresses taken by the write address counter. The third one RESET_WR_ADD is a signal for resetting the write address counter and for enabling a loading of the write address counter. The fourth one NRESET is a signal for resetting all signals.

The second module RD_CNT_ADD has preferentially four inputs signals. The first one ENA_RD is a signal for enabling a reading, hence for enabling a counter; the second one INC_DEC_CTRL is a signal for incrementing or decrementing the addresses taken by the read address counter. It is the same signal than for the first module. It enables a writing and a reading in a same address direction (from the top to the bottom addresses of the buffer BUF or vice et versa) when they are applied simultaneously, as it has been described previously.

The third signal LOAD_RD_CNT is a signal for enabling a loading of the read address counter. The fourth one NRESET is the same signal than the fourth signal of the first module.

When the loading of the read address counter is enabled, the read address counter takes the content of the write address counter. Thus, the last written address of a preceding window of data can be loaded into the read address counter for the reading of said preceding window of data.

Figure 7:
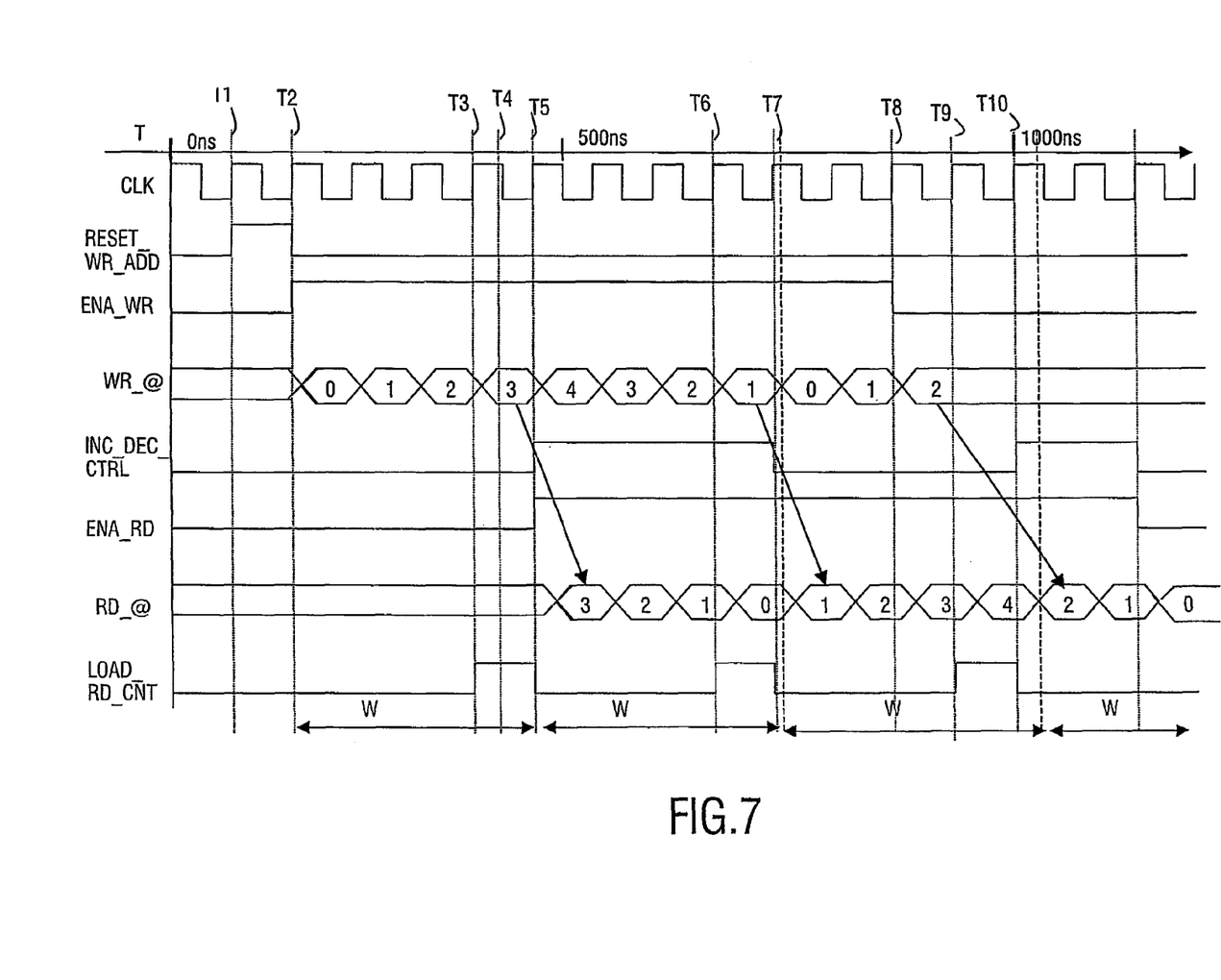
FIG. 7 shows a schedule of the addressing counters of FIG. 6, which is required to achieve a correct sequence of data according to the method of the invention.

FIG. 7 shows a required schedule to achieve a correct sequence for the write and read address counters. The used example is the classic sequence used before (the last window's size differs from other windows' size).

At T1, the write address counter is reset. At T2, the writing is enabled (ENA_WR=1), and the loading of the write address counter begins with the address WR_@=0, which is the bottom address B_ADD of the buffer BUF, as we have seen before. Note that the second signal INC_DEC_CTRL is set to 0. It means that the incrementation is activated. Therefore, the addresses are loaded incrementally. Hence, the address 1 is loaded; then, the address 2 is loaded. At T3, the third signal LOAD_RD_CNT for enabling the loading of the read address counter is activated. Then at T4, the address 3 is loaded in the writing address counter. This address 3 corresponds to the top address T_ADD taken in the example of FIG. 5. Then, at T5, the reading is enabled (ENA_RD=1), and the decrementation is activated (INC_DE C_CTRL=1).

The third signal LOAD_RD_CNT allows to achieve a loading, at the end of the first window w1 of data, of the last address of the write address counter into the read address counter, here it is the address 3. Note that the loading of such an address has priority to the incrementation or decrementation. It is done after the time T5, in parallel with the loading of the address WR_@=4 into the write address counter, which corresponds to the extra word memory added address WORD seen in the example of FIG. 5. The writing of a current window w2 of data and the reading of the preceding window w1 of data are done simultaneously, their corresponding addresses being decremented respectively from 4 to 1 and from 3 to 0.

At T6, the third signal LOAD_RD_CNT for enabling the loading of the read address counter is activated. It allows to achieve a loading, at the end of the second window w2, of the last address of the write address counter into the read address counter, here it is the address WR_@=1. At T7, the incrementation has been activated (INC_DEC_CTRL=0). At T8, the writing is disabled (ENA_WR=0). The last address 2 has been loaded into the write address counter. At T9, the loading of the read address counter is enabled (LOAD_RD_CNT=1).

At T10, the decrementation is activated (INC_DEC_CTRL =1). At the end of the third window w3, the last address of the write address counter is loaded into the read address counter; here it is the address 2. Then, data of the third window w3, which is the last window, are read.

Thus, thanks to this implementation of the address counters, an ideal or a classic sequence of data can be efficiently managed.

It is to be understood that the present invention is not limited to the aforementioned embodiments and variations and modifications may be made without departing from the spirit and scope of the invention as defined in the appended claims. In the respect, the following closing remarks are made.

It is to be understood that the present invention is not limited to the aforementioned UMTS application. It can be use within any application using a turbo-decoder for decoding data using windows of data.

It is to be understood that the method according to the present invention is not limited to the aforementioned implementation.

There are numerous ways of implementing functions of the method according to the invention by means of items of hardware or software, or both, provided that a single item of hardware or software can carries out several functions. It does not exclude that an assembly of items of hardware or software or both carry out a function, thus forming a single function without modifying the method of source decoding in accordance with the invention.

Said hardware or software items can be implemented in several manners, such as by means of wired electronic circuits or by means of an integrated circuit that is suitable programmed respectively. The integrated circuit can be contained in a computer or in a receiver. In the second case, the receiver comprises writing means adapted to make the writing of a current window, and reading means adapted to make the reading of a preceding window, as described previously, said means being hardware or software items as above stated.

The integrated circuit comprises a set of instructions. Thus, said set of instructions contained, for example, in a computer programming memory or in a decoder memory may cause the computer or the decoder to carry out the different steps of the decoding method.

The set of instructions may be loaded into the programming memory by reading a data carrier such as, for example, a disk. A service provider can also make the set of instructions available via a communication network such as, for example, the Internet.

Any reference sign in the following claims should not be construed as limiting the claim. It will be obvious that the use of the verb "to comprise" and its conjugations do not exclude the presence of any other steps or elements besides those defined in any claim. The word "a" or "an" preceding an element or step does not exclude the presence of a plurality of such elements or steps.

The invention claimed is:

1. A method for processing data for a decoding operation, said method using windows of data, each window comprising data to be written and to be read and having a size the method comprising:

writing a current window of data into a unique buffer in a first address direction, said first address direction being an opposite direction from an address direction of the writing of a preceding window of data, said writing of said current window beginning at an address where no data of the preceding window of data have been written, said unique buffer having a length greater than a maximum size of the windows of data; and reading the data of said preceding window of data from said unique buffer from a reading address equal to a last written address of the same preceding window of data, said reading of the data of said preceding window of data being made simultaneously to said writing of the current window of data, and in the same first address direction.

2. A method as claimed in claim 1, wherein the buffer has a length equal to the maximum size of the windows of data plus one.

3. A receiver utilizing said method as claimed in claim 1.

4. A computer-readable medium encoded with a data structure comprising a set of instructions, which, when loaded into a receiver, causes the receiver to carry out the method claimed in claim 1.

5. A computer-readable medium encoded with a data structure comprising a set of instructions, which, when loaded into a computer, causes the computer to carry out the method claimed in claim 1.

6. A method of processing data having a block size K divisible into a plurality, N, of windows of data, said method comprising:

(1) writing a first window of data into a unique buffer in a first address direction, said unique buffer having a length greater than a maximum size of the windows of data, (2) for i∈(1, N−1), simultaneously:
(i) writing an $(i+1)^{th}$ window of data into the unique buffer in an address direction opposite from an address direction of the writing of a preceding window of data, said writing of the $(i+1)^{th}$ window beginning at an address where no data of the preceding window of data have been written, and
(ii) reading an $i^{th}$ window of data from said unique buffer from a reading address equal to a last written address of the $i^{th}$ window of data, said reading being made in the same address direction as writing the $(i+1)^{th}$ window of data; and (3) reading the $N^{th}$ window of data from said unique buffer from a reading address equal to a last written address of the $N^{th}$ window of data, the reading of the $N^{th}$ window of data being in a direction opposite from the writing of the $N^{th}$ window of data.

7. The method of claim 6, wherein the buffer has a length equal to the maximum size of the windows of data plus one.

8. The method of claim 6, wherein for i ∈ (2, N−1), writing the $(i+1)^{th}$ window of data begins at a same address as writing an $(i-1)^{th}$ window of data.

9. The method of claim 6, wherein for i ∈ (1, N−2), reading an $(i+2)^{th}$ window of data begins at a same address as writing the $i^{th}$ window of data.

10. the method of claim 6, where for wherein for i ∈(1, N−2), in each window, writing the $(i+1)^{th}$ window of data begins at an address that is either one address greater or one address less than the last written address of the $i^{th}$ window of data.

* * * * *